(12) United States Patent
El-Ghazaly et al.

(10) Patent No.: US 9,773,612 B2
(45) Date of Patent: Sep. 26, 2017

(54) INTEGRATED MAGNETIC DEVICES WITH MULTI-AXIAL MAGNETIC ANISOTROPY

(71) Applicant: The Board of Trustees of the Leland Stanford Junior University, Palo Alto, CA (US)

(72) Inventors: Amal El-Ghazaly, Stanford, CA (US); Shan X. Wang, Portola Valley, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 59 days.

(21) Appl. No.: 14/675,657

(22) Filed: Mar. 31, 2015

(65) Prior Publication Data

US 2015/0206657 A1    Jul. 23, 2015

Related U.S. Application Data

(63) Continuation-in-part of application No. 14/528,593, filed on Oct. 30, 2014.
(Continued)

(51) Int. Cl.
*H01F 41/14* (2006.01)
*H01F 41/02* (2006.01)
(Continued)

(52) U.S. Cl.
CPC ............ *H01F 41/14* (2013.01); *H01F 41/02* (2013.01); *H01L 41/09* (2013.01); *H01L 41/12* (2013.01)

(58) Field of Classification Search
CPC ......... H01F 41/14; H01L 41/09; H01L 41/12; H01L 45/147
(Continued)

(56) References Cited

U.S. PATENT DOCUMENTS

| 6,279,406 B1* | 8/2001 | Li | G01R 33/18 73/861.08 |
| 2003/0005569 A1* | 1/2003 | Hiatt | H01F 17/0006 29/602.1 |

(Continued)

FOREIGN PATENT DOCUMENTS

| EP | 1901317 B1 | 3/2008 |
| JP | 11040427 | 2/1999 |
| JP | 2000296612 | 10/2000 |

OTHER PUBLICATIONS

Bhattacharya. "Tefrenol and Galfenols: Smart Magnetostrictive Metals for Intelligent Transduction". p. 36 2nd col. Found at http://www.iitk.ac.in/directions/dirnet7/P~BISHAKH~F~DIR7.pdf (Dec. 2008).*

(Continued)

*Primary Examiner* — Jose Hernandez-Diaz
(74) *Attorney, Agent, or Firm* — Lumen Patent Firm

(57) ABSTRACT

A method of fabricating in-plane or out-of-plane thin-film multi-axial magnetic anisotropy devices is provided that includes either depositing a magnetic material with perpendicular or partially perpendicular anisotropy patterned into a multi-directional, curved, or closed path or depositing a thin-film of magnetic material on a piezoelectric material, where the magnetic material is arranged in a pattern, depositing excitation electrodes on the piezoelectric material, where the excitation electrodes are arranged in a pattern, biasing the piezoelectric material, by applying a voltage across the excitation electrodes, where an electric field through the piezoelectric material is generated by the applied voltage across the excitation electrodes, where the piezoelectric material is biased by the electric field to provide stress to the magnetic material, where the stress rotates a magnetization of the magnetic material, and pat- (Continued)

terning the magnetic material into a multi-directional, curved, or closed path.

8 Claims, 8 Drawing Sheets

Related U.S. Application Data

(60) Provisional application No. 61/897,455, filed on Oct. 30, 2013.

(51) Int. Cl.
*H01L 41/09* (2006.01)
*H01L 41/12* (2006.01)

(58) Field of Classification Search
USPC ....... 427/58, 128, 532, 547, 598, 548; 257/2
See application file for complete search history.

(56) References Cited

U.S. PATENT DOCUMENTS

| | | |
|---|---|---|
| 2011/0116194 A1 | 5/2011 | Viala |
| 2011/1011619 | 5/2011 | Bernard Viala |
| 2013/0163313 A1* | 6/2013 | Tiercelin ............... G11C 11/16 365/157 |
| 2014/0203398 A1* | 7/2014 | Sturcken ............... H01L 28/10 257/531 |
| 2014/0240074 A1* | 8/2014 | Qui ............... G11C 19/0808 336/211 |

OTHER PUBLICATIONS

See path. (n.d.). Dictionary.com Unabridged. Retrieved Jul. 24, 2016 from Dictionary.com website http://www.dictionary.com/browse/path.*

Lebedev et al. "Converse magnetoelectric effect dependence with CoFeB composition in ferromagnetic/piezoelectric composites", Mar. 13, 2012,07C725-1 to 07C725-3,Journal of Applied Physics 111.

Lebedev et al. "Voltage-Controlled Uniaxial Magnetic Anisotropy in Soft Magnetostrictive Ferromagnetic Thin Films", Oct. 2011, 4037-4040, IEEE Transactions on Magnetics, vol. 47, No. 10.

Arai et al. "A New Hybrid Device using Magnetostrictive Amorphous Films and Piezoelectric Substrates", Mar. 1994, 916-918, IEEE Transactions on Magnetics, vol. 30, No. 2.

Lou et al. "Electrostatically tunable magnetoelectric inductors with large inductance tunability", Applied Physics Letters 94, 112508 (2009)112508-1 to 112508-3.

Dong et al. "Tunable Features of Magnetoelectric Transformers", Jun. 2009, 1124-1127, IEEE Transactions on Ultrasonics, Ferroelectrics, and Frequency Control, vol. 56, No. 6.

Lebedev et al. "Electric field controlled magnetization rotation in exchange biased antiferromagnetic/ferromagnetic/piezoelectric composites", 232502-1 to 232502-3, Applied Physics Letters 99, 232502 (2011).

* cited by examiner

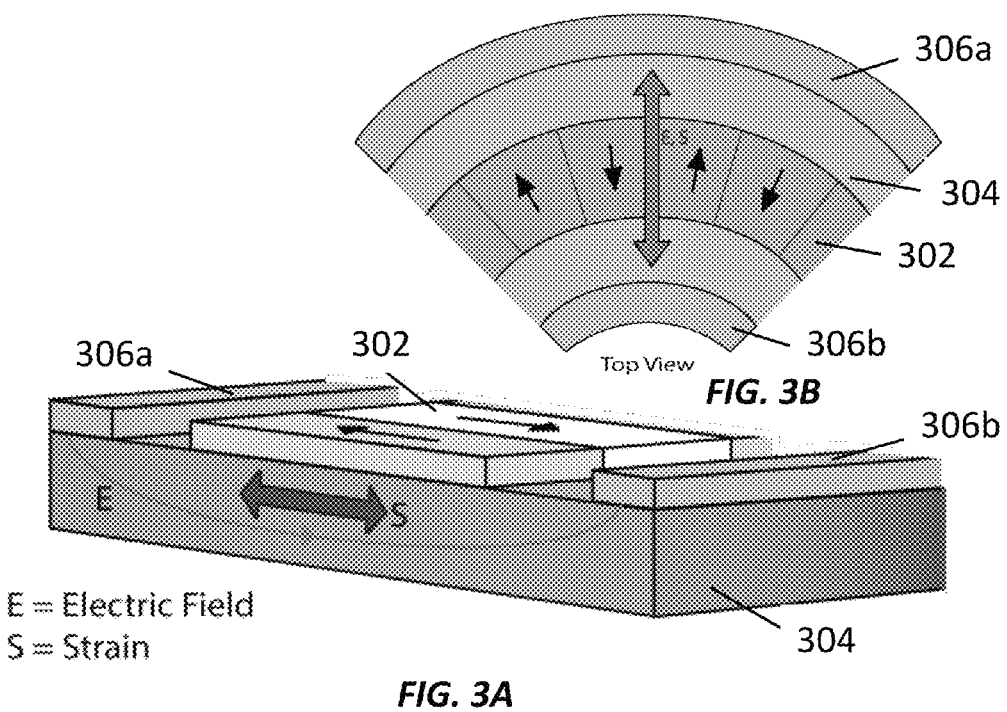
FIG. 3B
E = Electric Field
S = Strain
FIG. 3A
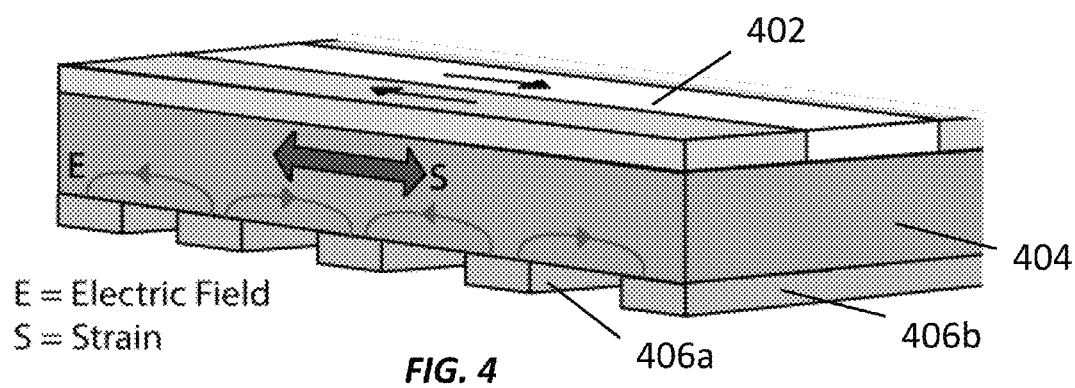
E = Electric Field
S = Strain
FIG. 4

E = Electric Field
S = Strain

Side View

Longitudinal Initialization

45° Initialization

INTEGRATED MAGNETIC DEVICES WITH MULTI-AXIAL MAGNETIC ANISOTROPY

CROSS-REFERENCE TO RELATED APPLICATIONS

This application is a continuation-in-part of U.S. patent application Ser. No. 14/528,593 filed Oct. 30, 2014, which is incorporated herein by reference. Application Ser. No. 14/528,593 claims priority from U.S. Provisional Patent Application 61/897,455 filed Oct. 30, 2013, which is incorporated herein by reference.

FIELD OF THE INVENTION

The invention generally relates to high frequency thin-film magnetic inductors and transformers. More specifically, the invention relates to integrated magnetic devices requiring non-uniform or radial anisotropy.

BACKGROUND OF THE INVENTION

Magnetic flux flows along the path of least reluctance, i.e. the path of greatest permeability. As a result, high frequency integrated magnetic devices are designed and fabricated such that the AC magnetic field is applied along the direction of greatest permeability. This design choice requires that the hard-axis of the magnetic core be oriented parallel to the AC field (i.e. the easy-axis perpendicular to the field), resulting in maximum quality factor and magnetic coupling efficiency. A drawback of current fabrication methods is that they typically permit only a single, uniform field to be applied during deposition. Under such deposition conditions, closed magnetic loops cannot be easily fabricated for maximum efficiency since only the regions perpendicular to the applied field emerge with induced hard-axis permeability.

Previous work has been done on the control of permeability post-fabrication, however the application has been mostly focused on frequency and inductance tuning of magnetic devices during operation. Such work includes topologies directed to an electromagnetic conversion element and variable inductance that utilize a sandwiched magnetic and piezoelectric beam structure, and a general inductance device in which the permeability and inductance are varied using a comb-like electrode on a piezoelectric/magnetic composite structure.

In-situ tuning of inductors using a bias current in an integrated tunable magnetic RF inductor has been attempted. Other variations include processing and application of magnetoelastic thin films in high-frequency devices in electrostatically tunable magnetoelectric inductors with large inductance tunability.

Other work has been directed to control of permeability, however it continues to be limited to linear magnetic thin-film structures. In the prior work, the permeability of a radio frequency (RF) magnetic device was varied while seated on top of and controlled by a suspended, mobile piezoelectric material.

For thin-film magnetic cores forming closed magnetic loops, a single applied field during deposition is not sufficient to induce universal hard-axis permeability throughout the loop. For example, in a toroid, regions where the magnetic core is parallel to the applied field during deposition obtain local easy-axis permeability, which is effectively zero for high-frequency alternating currents and therefore does not contribute to the performance of the device.

What is needed is, a method for fabricating thin-film magnetic cores with multi-axial anisotropy, resulting in a composite multiferroic device that induces a local magnetic anisotropy in the desired direction post-deposition.

SUMMARY OF THE INVENTION

To address the needs in the art, a method of fabricating a thin-film multi-axial magnetic anisotropy device is provided that includes depositing a thin-film of magnetic material on a piezoelectric material, where the magnetic material is arranged in a pattern, depositing excitation electrodes on the piezoelectric material, where the excitation electrodes are arranged in a pattern, biasing the piezoelectric material, by applying a voltage across the excitation electrodes, where an electric field through the piezoelectric material is generated by the applied voltage across the excitation electrodes, where the piezoelectric material is biased by the electric field to provide stress to the magnetic material, where the stress rotates a magnetization of the magnetic material, and patterning the magnetic material into a multi-directional path, a curved path, or a closed path.

According to one aspect of the invention, the rotation of the magnetization is up to 90 degrees in the plane of the magnetic material thin-film or out of the plane of the magnetic material thin-film.

In another aspect of the invention, the piezoelectric material can include PZT, $PbTiO_3$, AN, $BaTiO_3$, PVDF, PMN, PMN-PT, PZN-PT, or PLZT.

In a further aspect of the invention, the magnetic material can include cobalt, iron, or nickel based alloys.

In one aspect, the magnetic material is formed by alternating layers of the magnetic material and an insulating material that includes oxides, nitrides, or carbides.

According to yet another aspect of the invention, the pattern includes elements having shapes that include straight, curved, parallel, square, rectangular, diamond, honeycomb, rhomboidal, trapezoidal, annular, ellipsoidal, oval, circular or a closed-loop shape.

According to a further aspect of the invention, the thin-film multi-axial magnetic anisotropy device includes a stack of alternating layers of the piezoelectric material and the magnetic material.

In a further aspect, the electrodes are disposed on a side, a top or a bottom of the thin-film multi-axial magnetic anisotropy device.

According to one embodiment the invention includes a method of fabricating a thin-film multi-axial magnetic anisotropy device that includes depositing a thin-film of magnetic material where the magnetic material has perpendicular or partially perpendicular anisotropy, and patterning the magnetic material into a path, a curved path, or closed path.

According to the current embodiment of the invention, the magnetization is up to 90 degrees out of the plane of the magnetic material thin-film.

In another aspect of the current embodiment, the deposition of the magnetic material includes using sputtering, evaporation, electroplating, and melt spinning.

In a further aspect of the current embodiment, the magnetic material can include cobalt, iron, or nickel based alloys.

In yet another aspect of the current embodiment, the magnetic material includes alternating layers of the magnetic material and an insulating material, where the insulating material can include oxides, nitrides, or carbides.

According to a further aspect of the current embodiment, the magnetic material pattern includes elements having shapes that include straight, curved, parallel, square, rectangular, diamond, honeycomb, rhomboidal, trapezoidal, annular, ellipsoidal, oval, circular or a closed-loop shape.

BRIEF DESCRIPTION OF THE DRAWINGS

FIGS. 3A-3B show perspective and top views of a single electrode version of the composite piezoelectric/magnetic heterostructure optimized for $d_{33}$ piezoelectric response, according to one embodiment of the invention.

FIG. 4 shows a multiple, interdigitated-electrode version of the composite piezoelectric/magnetic heterostructure optimized for $d_{33}$ piezoelectric response and positive magnetostriction, according to one embodiment of the invention.

DETAILED DESCRIPTION

A fabrication method for in-situ control and correction of induced magnetic anisotropy is provided, where a composite multiferroic device is disposed to induce, post-deposition, a local magnetic anisotropy in the desired direction. The resulting device is a heterostructure having hard piezoelectric and soft magnetic layers, formed such that an applied voltage across the piezoelectric layer results in strain that translates to stress in the magnetic layer. According to one embodiment, properly matching the piezoelectric and magnetostrictive properties of the two materials results in stress that is sufficient to rotate the magnetization of the magnetic layer, where the hard piezoelectric will hold its strain and the electric bias can be removed while still maintaining the new magnetization direction of the magnetic core. The method according to the current invention provides a solution for fabricating thin-film magnetic cores with multi-axial anisotropy.

The current invention provides a method for fabricating thin-film magnetic cores with local multi-axial, radial, or non-uniform anisotropy. The invention provides solutions for producing efficient high-frequency integrated magnetic components by aligning the hard axis permeability and flux path with the curvature of the magnetic element.

According to one embodiment, the invention has at least a portion of the core as a curved heterostructure that incorporates a magnetostrictive ferromagnetic core, which may be laminated according to one aspect. In a further embodiment, the invention includes a piezoelectric material disposed to control the domains. In yet another embodiment, the invention includes a single pair of excitation electrodes, or a series of excitation electrodes attached to the piezoelectric material, that follows the curvature of the structure. In one embodiment, the invention incorporates other non-linear core configurations that require high permeability throughout.

Figure 1:
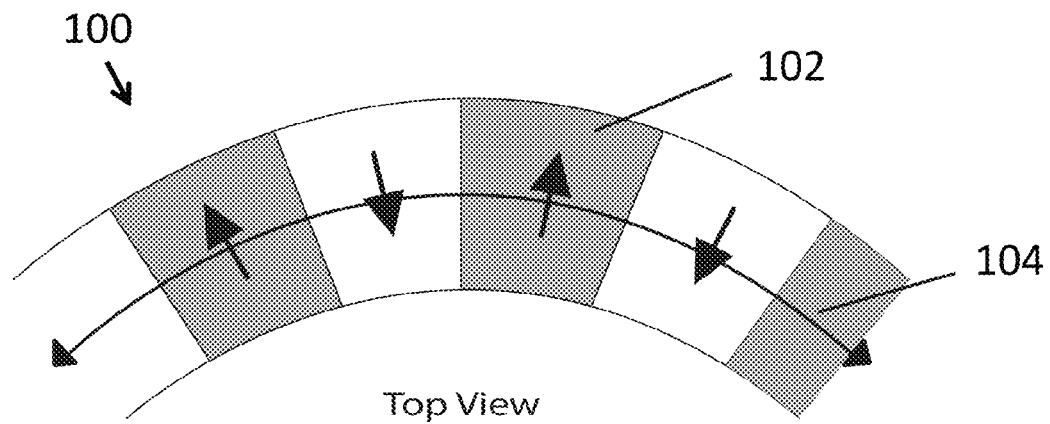
FIG. 1 shows ideal magnetic domains and hard-axis permeability resultant from induced radial anisotropy through a curved magnetic core structure, according to one embodiment of the invention.

FIG. 1 shows one embodiment of a thin-film magnetic cores with multi-axial anisotropy device 100, where the ideal easy-axis orientation of magnetic domains 102 in a curved region of magnetic material when a radial anisotropy is induced in the film. Also shown is the rotational flux path 104 following the curvature of the film and the direction of least reluctance and highest permeability. This high permeability path is the result of the hard-axis magnetization along the curve, i.e. the direction of highest permeability is perpendicular to the easy-axis orientation.

Figure 2:
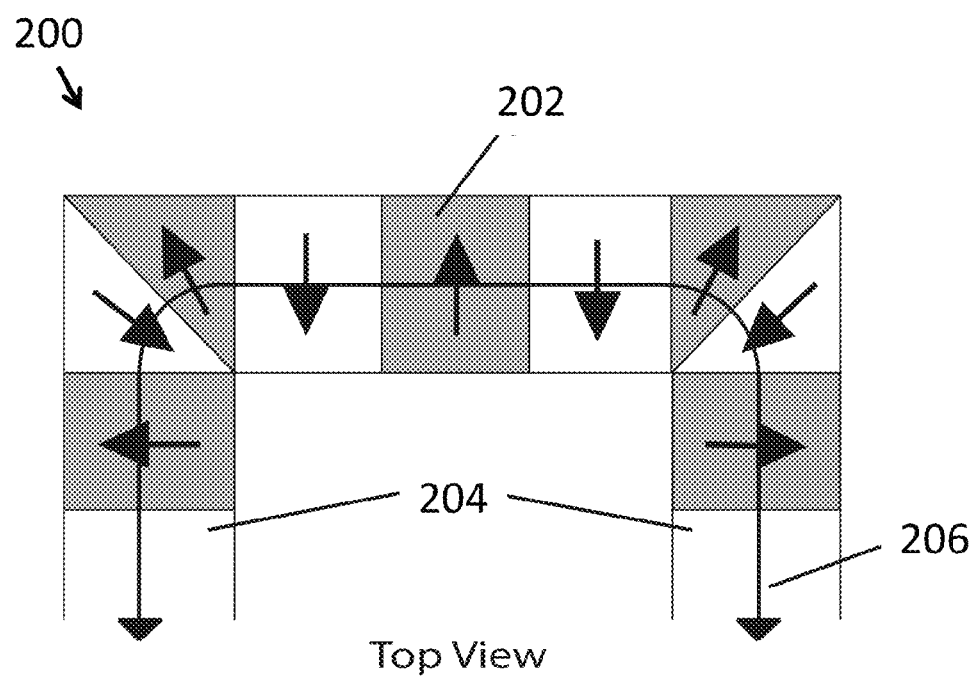
FIG. 2 shows ideal magnetic domains and hard axis permeability resultant from induced multi-axial anisotropy through a multi-axial core segment, according to one embodiment of the invention.

FIG. 2 shows another embodiment of the thin-film magnetic cores with multi-axial anisotropy device 200 showing a similar concept in which multiple ideal easy-axes are induced in a film with rectangular contour. Magnetization in parallel legs of the core 202 can be easily induced during deposition. However, magnetization of the perpendicular leg 204 would require specialized processing for which there is currently no precedent. The hard-axis permeability 206 is achieved longitudinally in each segment of the film, despite the fact that the film contains 90° angles in the flux path, in this embodiment.

The invention provides a device that has the form of a multi-axial magnetic core and piezoelectric composition structure. The piezoelectric material has properties such that under an applied electric field it exerts compressive or tensile stress on the adjacent magnetic layer. The magnetic material has magnetostrictive properties such that under an applied stress it rotates its magnetization accordingly, where negative magnetostriction under tensile stress results in 0° rotation of magnetization; negative magnetostriction under compressive stress results in up to 90° rotation of magnetization; positive magnetostriction under tensile stress results in up to 90° rotation of magnetization; and positive magnetostriction under compressive stress results in 0° rotation of magnetization.

In one embodiment, the piezoelectric and magnetic films are deposited with Radio Frequency (RF) diode sputtering, sputtering, evaporation, electroplating, melt spinning or any other applicable method. After patterning and fabrication of the structure and electrical contacts, the piezoelectric material is biased to provide sufficient stress to rotate the magnetization in the magnetic material.

FIG. 3A, FIG. 3B and FIG. 4 show further embodiments of the arrangements of the electrodes for the case of a piezoelectric material optimized for $d_{33}$ excitation and a magnetic material with positive magnetostriction. The electrodes are attached to the piezoelectric material 304, 404 such that a voltage applied across the electrodes 306a, 306b, 406a and 406b create an electric field through the material and result in parallel strain of the piezoelectric proportional to the $d_{33}$ coefficient. The electrodes are designed as single electrodes, as in FIG. 3, or a series of interdigitated-electrodes with alternating polarity, as in FIG. 4, that match the contour of the magnetic material 302, 402.

Figure 5:
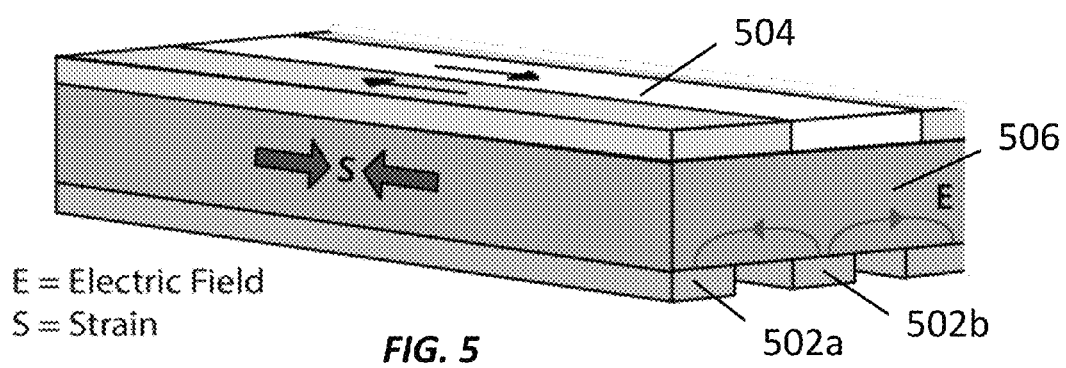
FIG. 5 shows a multiple, interdigitated-electrode version of the composite piezoelectric/magnetic heterostructure optimized for $d_{31}$ piezoelectric response and negative magnetostriction, according to one embodiment of the invention.

FIG. 5 shows a further embodiment of the invention having the electrodes 502a and 502b for a piezoelectric material optimized for $d_{31}$ excitation and a magnetic material with negative magnetostriction. The electrodes 502a and 502b are attached to the piezoelectric material 506 as a series of interdigitated-electrodes with alternating polarity such that a voltage applied across the electrodes creates an electric field in-plane through the material and results in orthogonal compressive strain of the piezoelectric/magnetic structure 506 and 504, respectively, that is proportional to the $d_{31}$ coefficient.

Figure 6:
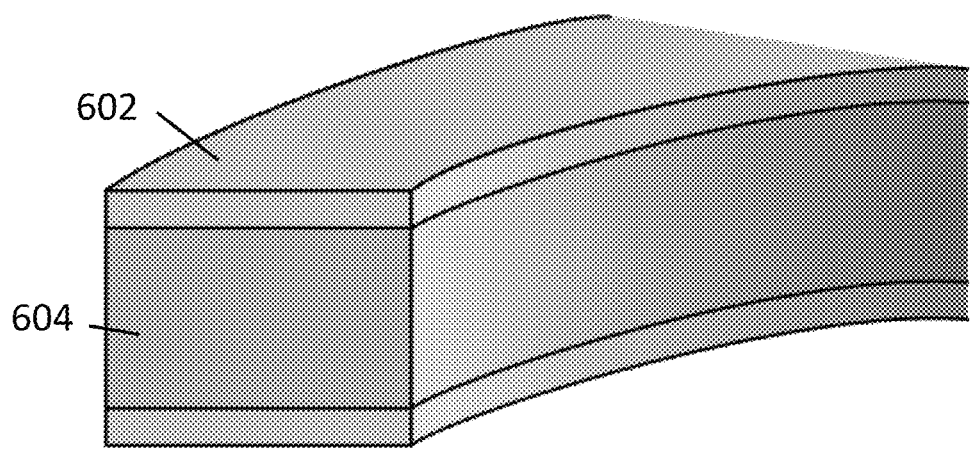
FIG. 6 shows a heterostructure configuration with the piezoelectric material on the top and/or bottom of the magnetic material, according to one embodiment of the invention.
Figure 7:
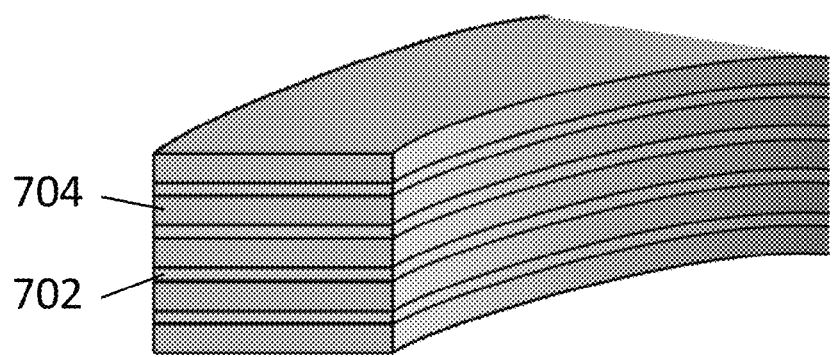
FIG. 7 shows a heterostructure configuration with the piezoelectric and magnetic materials forming alternating layers within the stack, according to one embodiment of the invention.

According to further embodiments, the heterostructure configurations shown in FIG. 6 and FIG. 7 show the piezoelectric 602/702, respectively, and magnetic materials 604/704, respectively, in the stack. FIG. 6 shows a stack with either one or two piezoelectric layers 602 on the surface(s) of the magnetic material 604. This embodiment provides simplicity of fabrication, but requires a relatively strong piezoelectric response in order to induce strain sufficient to penetrate the entire thickness of the magnetic material 604 and result in the rotation of the magnetization throughout. The stack shown in FIG. 7 is most effective for weaker piezoelectric insulators. Insulating piezoelectric materials 702 can be incorporated repeatedly into the magnetic core structure to laminate the magnetic material 704, simultaneously reducing eddy current losses and providing a combined mechanical effect from all of the layers that is sufficient to switch the magnetization. In this configuration, however, while uniform vertical electric biases are achieved, producing a uniform horizontal field in all the independent piezoelectric layers is difficult unless electrical contact is made to each independent layer.

The embodiment shown in FIG. 6 provides a practical solution for structures using piezoelectric or electrostrictive materials with particularly large strain-voltage coefficients, where the materials include PZT, $PbTiO_3$, and relaxor ferroelectrics such as PMN, PMN-PT, PZN-PT, and PLZT. Additionally, it provides the simplicity of applying an electric bias to only one or two piezoelectric layers. On the other hand, the configuration shown in FIG. 7 provides the advantage of utilizing a single material for both insulating laminations to reduce eddy current losses in the magnetic film, and piezoelectric control to induce a local magnetic anisotropy. Examples of piezoelectric materials include AN, $BaTiO_3$, and PVDF. Deposition and patterning of the alternating piezoelectric and magnetic layers require considerable effort. Additionally, in order to take advantage of the $d_{33}$ strain, an in-plane electric field is generated. For thin magnetic stacks, interdigitated-electrodes are used. However, larger stack thicknesses may require electrical contacts to each of the independent piezoelectric layers, making the fabrication much more complex.

Figure 8:
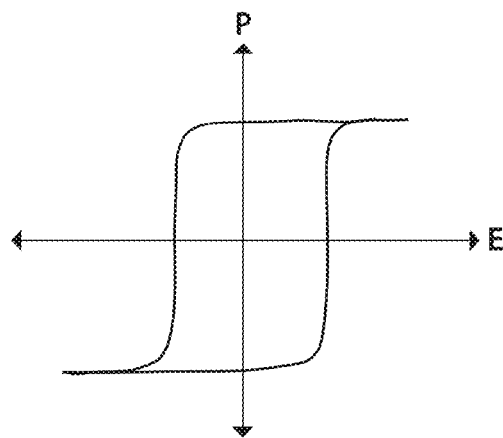
FIG. 8 shows an ideal piezoelectric polarization response, where the hysteresis loop demonstrates large coercivity and remanence, according to one embodiment of the invention.
Figure 9:
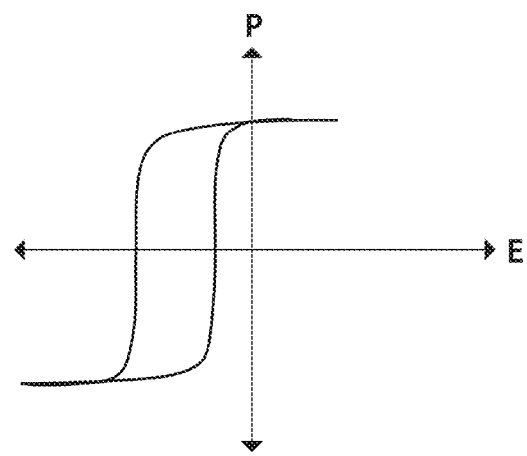
FIG. 9 shows an ideal piezoelectric polarization response, where the hysteresis loop demonstrates large coercivity and remanence as well as a degree of imprint, providing an almost saturated piezoelectric behavior at zero field, according to one embodiment of the invention.

In one embodiment, a piezoelectric material with piezoelectric hysteresis loop of the form shown in either FIG. 8 or FIG. 9 is provided. The material represented by the hysteresis curve in FIG. 8, once poled, is characterized by a large coercive field, square hysteresis loop, and high remnant polarization at zero electric field. The material represented by the hysteresis curve in FIG. 9 is characterized by imprint polarization in which the structure itself induces a polarization and additional field would be required to randomize, or zero, the polarization. Given these material properties, a voltage bias is applied to produce saturation electric field to saturate the sample's piezoelectric response. The remanent piezoelectric response, when the bias is removed, is used to induce that magnetic anisotropy without the need for continued electrical control.

Figure 10:
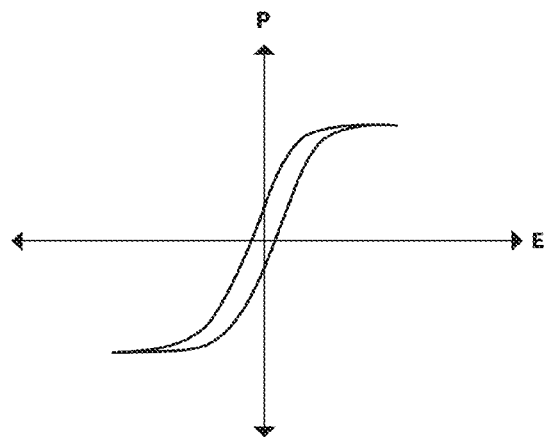
FIG. 10 shows an ideal piezoelectric polarization response, where the hysteresis loop is described by a linear behavior for small applied field values, according to one embodiment of the invention.
Figure 11:
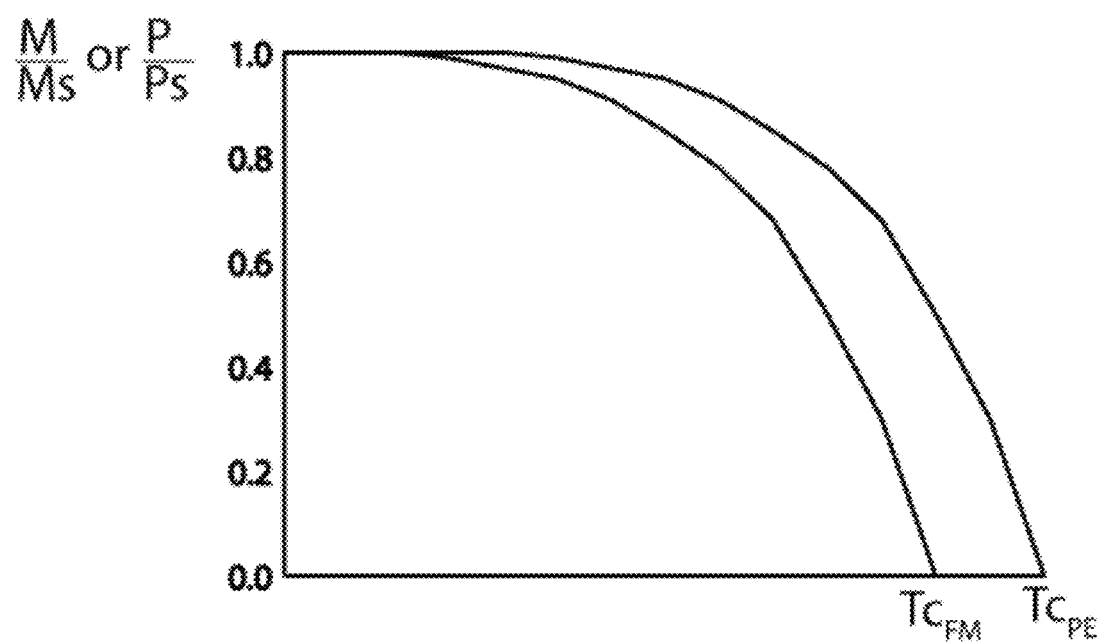
FIG. 11 shows an ideal comparison of the Curie temperatures of the piezoelectric and magnetic materials for an alternative embodiment of the device, where the piezoelectric Curie temperature is much higher than that of the magnetic material, according to one embodiment of the invention.

In another embodiment, a linear piezoelectric with hysteresis loop shown in FIG. 10 is used in the composite structure if an electric field is applied during the annealing process. The polarization of such a material is linearly proportional to an applied bias within a given rage of electric fields. However, once the field is removed, it retains little to no remanent polarization. Thus, in order to utilize a linear piezoelectric for control of magnetic anisotropy, a constant bias is applied to the piezoelectric while setting the magnetization. This embodiment enables utilization of linear piezoelectrics when the Curie temperatures of the piezoelectric, $Tc_{PE}$, and magnetic, $Tc_{FM}$, materials behave as shown in FIG. 11. For piezoelectrics with high Curie temperatures, a continuous bias is applied to induce a temporary polarization and provide stress to the magnetic material during annealing. The heterostructure is then annealed at a low temperature ($T<T_c$) under these same stressed conditions such that the desired anisotropy is induced in the magnetic film. After annealing, the bias can be removed from the piezoelectric, but the magnetic material will retain its newly induced, local magnetization pattern.

Figure 12:
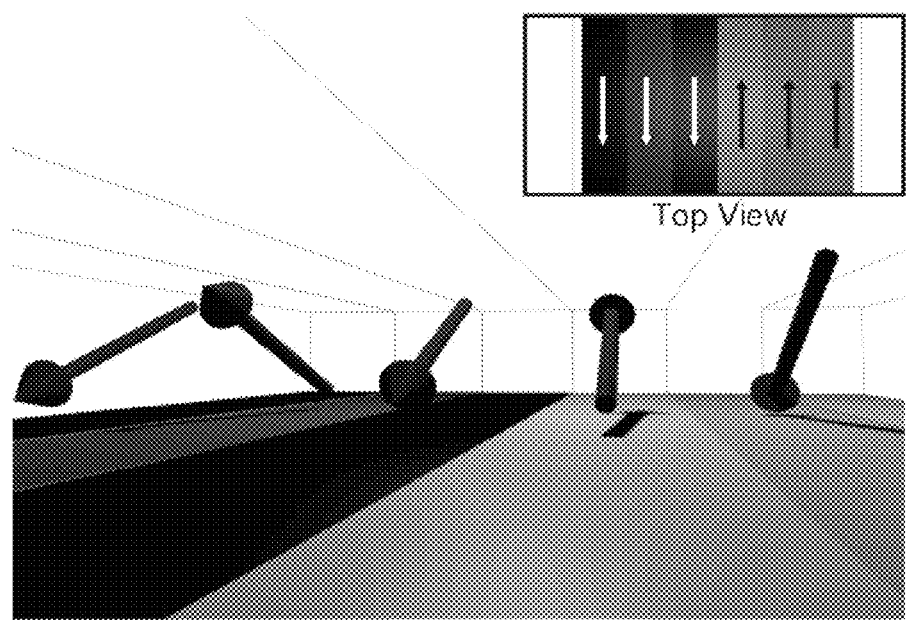
FIG. 12 show a model of local magnetization vectors in the stripe domains demonstrating partially perpendicular anisotropy, where lighter domains correspond to regions of uniform in-plane magnetization, with local contrast depicting the out-of-plane angle, similar to what would be seen in a MOKE image, according to one embodiment of the invention.
Figure 13:
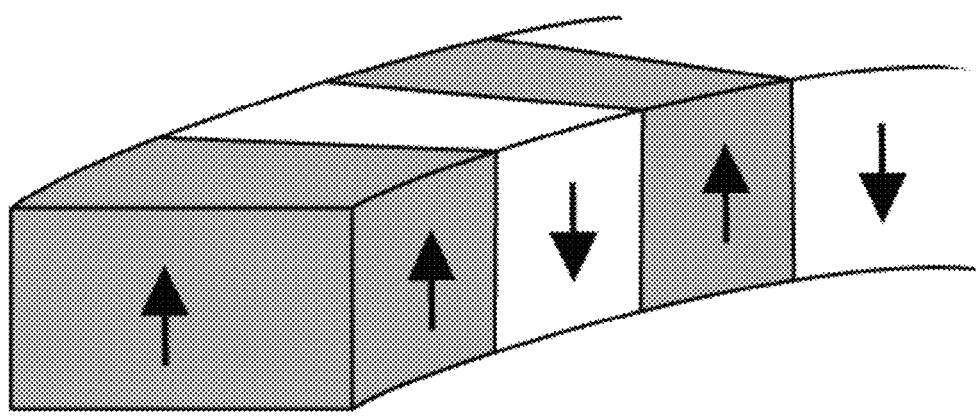
FIG. 13 shows a side view of ideal perpendicular magnetic domains from induced perpendicular multi-axial anisotropy to a multi-axial core segment, according to one embodiment of the invention.

In one exemplary embodiment of the invention, partially perpendicular anisotropy or perpendicular anisotropy in magnetic thin films are provided that produce reliably isotropic permeability in the plane of the film, as shown in FIG. 12 and FIG. 13, respectively. According to the current embodiment, isotropic permeability is especially desirable for integrated closed-loop magnetic solenoid inductors in order to create an efficient return path for the flux. Material properties for the partially perpendicular anisotropic films are verified and presented through hysteresis loop, permeability, and Magneto-Optic Kerr Effect (MOKE) microscopy and utilized to simulate the behavior of the inductor. Laminated magnetic films with partially perpendicular anisotropy yield a relatively high permeability value isotropically in-plane.

According to the current embodiment, partially perpendicular anisotropy exists in thin stripe domains that form to balance the magnetostatic energy resulting from the slight out-of-plane angle. The out-of-plane component of the magnetization alternates in each of these domains, as shown in FIG. 12. The stripe domains align parallel to the in-plane magnetization direction. However, since the easy axis is out-of-plane and no in-plane preferential direction exists, the domains are easily rotated by a saturating applied field along any in-plane direction. In a similar way, the perpendicular magnetization in FIG. 13 can be rotated to any in-plane direction, thereby yielding high isotropic permeability in the plane of the film.

The critical thickness of rotatable anisotropy in permalloy films is approximately $t_c$>320 nm. In one exemplary embodiment, laminated permalloy films were RF sputter deposited with alternating magnetic layers and 10 nm $SiO_2$ insulating layers. The thickness of the magnetic layers was chosen to satisfy the critical thickness criteria for both perpendicular anisotropy and eddy current losses. Assuming a conductivity $\sigma=5\times10^6\ \Omega^{-1}m^{-1}$ and permeability $\mu=2000\mu_0$ for permalloy, the skin depth at 1 GHz is 400 nm. Since the FMR frequency for permalloy is less than 1 GHz, the magnetic layer thickness was chosen as 400 nm in order to minimize the eddy current effects in the permeability spectrum. The base pressure prior to deposition was $10^{-7}$ Torr, and depositions took place in 3 mTorr Ar gas sputtering pressure, 150 W RF power, and a deposition rate of approximately 22 nm/min.

The laminated permalloy films were patterned into 500 um×L dimensions (where L varied from 200 to 1000 μm). Magneto-Optic Kerr Effect images were taken for the various film sizes from blanket down to the L=200 um pattern. While it has been reported that the rotatable anisotropy effect disappeared after patterning, the patterned films produced in these experiments maintain the stripe domains and isotropic permeability even after wet-etch patterning. The relative permeability is actually increased by patterning, since demagnetization in the plane causes the magnetization to prefer orienting further out-of-plane.

Figure 14A:
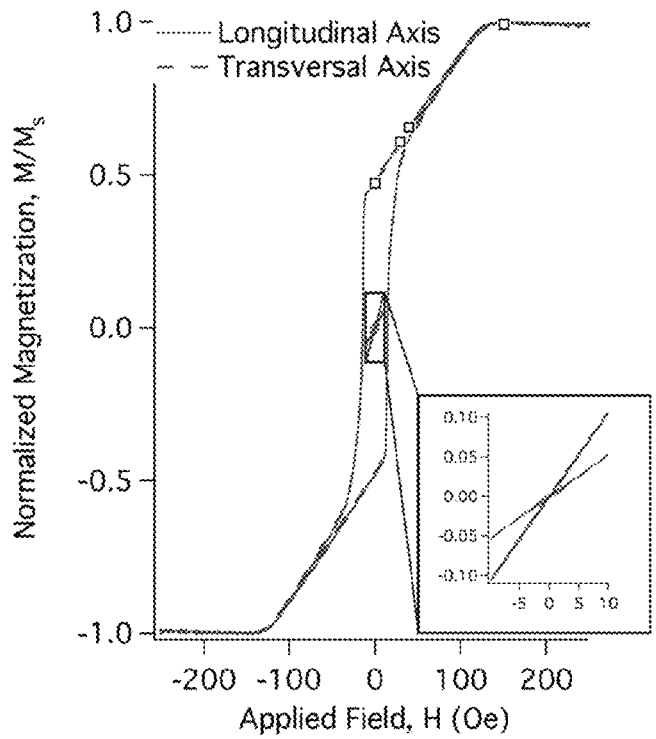
FIGS. 14A-14B show hysteresis loops for FIG. 14A both the longitudinal and transversal axis directions and for FIG. 14B 45° initialization direction, where the insets of small excitations illustrate the susceptibilities along longitudinal and transversal directions under 10 Hz AC field magnitudes of 2.5 Oe and 10 Oe when the magnetization is initialized along the (FIG. 14A) longitudinal, and (FIG. 14B) 45° axes, where square data points mark the applied field values corresponding to the MOKE images in FIG. 16, according to one embodiment of the invention.
Figure 14B:
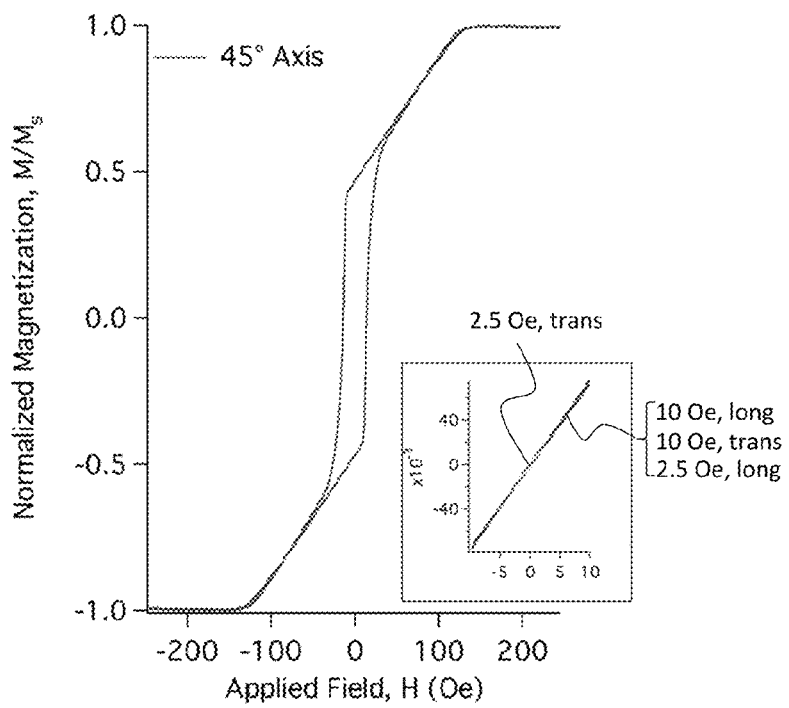
Figure 15:
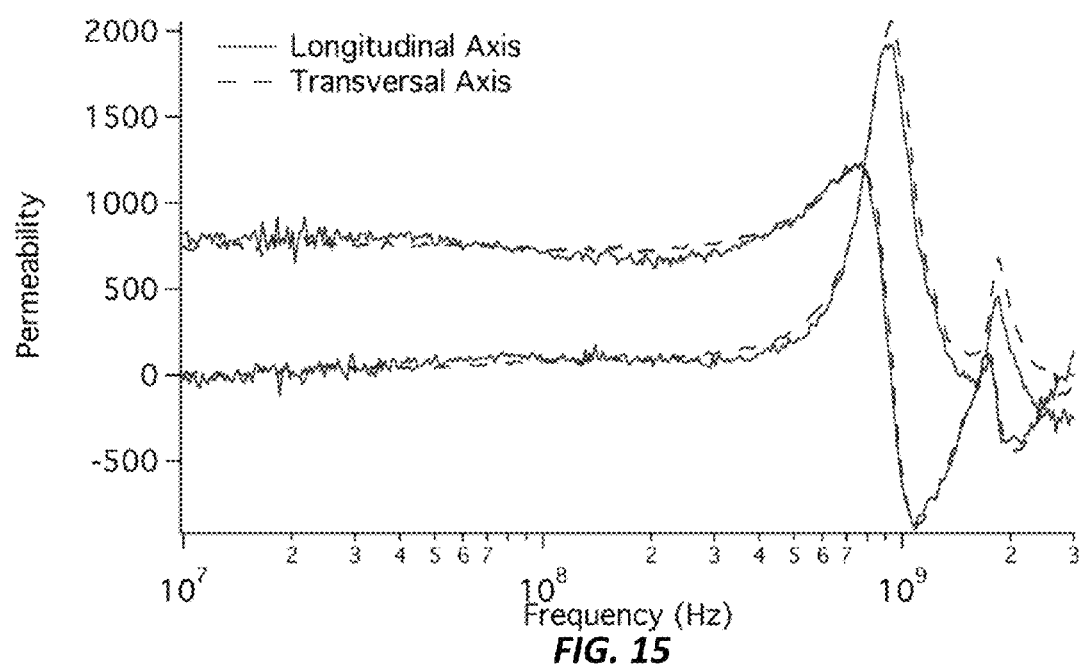
FIG. 15 shows permeabilities along the longitudinal and transversal directions for a NiFe sample with partially perpendicular anisotropy demonstrating isotropic in-plane permeability, according to one embodiment of the invention.

Regarding the material characterization, the laminated permalloy films shared similar properties to other rotatable initial susceptibility (RIS) films, but differ on a few key points that make these films ideal for small signal, closed loop magnetic inductors. The hysteresis loops for a double layer laminated permalloy film in FIGS. 14A-14B demonstrate the archetypal hysteresis loops for rotatable anisotropy. The large remanence and steep initial magnetization slope corresponds to the behavior of the in-plane magnetization component, while the linear magnetization behavior until final saturation corresponds to the out-of plane component. Both the longitudinal and transversal loops overlap indicating isotropic in-plane behavior. Furthermore, the small excitation loops in FIG. 14A support the findings that the susceptibilities along the two in-plane directions are different when the film is initialized to saturation along either of the two axes. However, when initialized by a saturating field along the 45° direction (FIG. 14B), the small-drive responses suggest isotropic high permeability for small signal AC fields along both the longitudinal)(0° and transversal)(90° axes as a result of spin rotation. The high permeability behavior was confirmed by measurements using a Ryowa permeameter (FIG. 15). Again, the behavior is seen to be isotropic.

After a large saturating field is applied, the film maintains a large remanence along the same direction, suggesting that the magnetization has a larger component in the plane of the film than in the perpendicular direction. The remainder of the magnetization points out-of-plane and linearly rotates into the plane gradually until the magnetization is fully saturated at approximately 150 Oe. The partial perpendicular anisotropy of the film was confirmed by alternating gradient magnetometer (AGM) out-of-plane measurements. Both remanence and large coercivity were found to exist out-of-plane. The source of the perpendicular anisotropy in this exemplary embodiment is assumed to be columnar growth in the permalloy films combined with magnetostrictive effects. However, in other magnetic embodiments, the perpendicular anisotropy may originate from other sources. The saturation magnetostriction for this embodiment's $Ni_{81}Fe_{19}$ composition was previously measured to be 4.7× $10^{-8}$. Thus, positive magnetostriction, plus a likely tensile strain out-of-plane due to columnar growth results in an easy axis in that direction. Interestingly, this partial perpendicular anisotropy yielded effectively isotropic permeability at high frequencies as given by the permeability spectra in FIG. 15 and the small signal susceptibilities in FIG. 14B when initialized along the 45° direction. Relative to the direction of the stripe domains, the mechanism for permeability along the orthogonal direction is assumed to be always in spin rotation and is therefore quite high and constant for all AC field values. On the other hand, the permeability along the in-plane longitudinal axis (parallel to the domains) appears to be dependent upon applied field value, which suggests that different mechanisms dominate the permeability at various fields. For small, low frequency signals, the permeability is higher because it is a combination of domain wall motion and spin rotation of the out-of-plane component down into the plane. However, once the magnitude of the low frequency AC field nears or exceeds the coercivity, the remaining permeability is predominantly spin rotation of the out-of-plane component since most of the domain walls have been swept out to leave unidirectional magnetization. Moreover, at high frequencies, the contribution of domain wall motion to permeability diminishes. Thus, when initialized along the 45° direction, the high frequency permeability for both longitudinal and transversal directions are the same and assumed to be primarily due to spin rotation.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. For example variations in the design of the magnetic closure, including the number of magnetic return paths for flux or non-planar structures, variations in the design of the electrodes, including interdigitated electrodes on multiple sides of the magnetoelectric stack, and/or variations in the design of the piezoelectric, including wrapping, clamping or any other contortion. Additional examples may include various methods of producing perpendicular anisotropy in the magnetic core such as patterning vertical magnetic pillars or other columnar designs, or incorporating seed layers (underlayers) for the magnet to induce perpendicular grain growth.

All such variations are considered to be within the scope and spirit of the present invention as defined by the following claims and their legal equivalents.

What is claimed:

1. A method of fabricating a thin-film multi-axial magnetic anisotropy device, comprising:
   a) depositing a thin-film of magnetic material on a piezoelectric material, wherein said magnetic material is arranged in a pattern;
   b) depositing excitation electrodes on said piezoelectric material, wherein said excitation electrodes are arranged in a pattern; and
   c) biasing said piezoelectric material, by applying a voltage across said excitation electrodes, wherein an electric field through said piezoelectric material is generated by said applied voltage across said excitation electrodes, wherein said piezoelectric material is biased by said electric field to provide stress to said magnetic material, wherein said stress rotates a magnetization of said magnetic material, wherein a multi-axial magnetic anisotropic pattern is formed, wherein said multi-axial magnetic anisotropic pattern comprises an open pattern or a closed pattern that is disposed along a multi-directional contour, a curved contour, or a closed contour.

2. The method according to claim 1, wherein said rotation of said magnetization is up to degrees 90 in the plane of said magnetic material thin-film or out of the plane of said magnetic material thin-film.

3. The method according to claim 1, wherein said piezoelectric material is selected from the group consisting of PZT, $PbTiO_3$, AN, $BaTiO_3$, PVDF, PMN, PMN-PT, PZN-PT, and PLZT.

4. The method according to claim 1, wherein said magnetic material is selected from the group consisting of cobalt, iron, or nickel based alloys.

5. The method according to claim 4, wherein said magnetic material is formed by alternating layers of said magnetic material and an insulating material selected from the group consisting of oxides, nitrides, and carbides.

6. The method according to claim 1, wherein said multi-axial magnetic anisotropic pattern further is disposed along contours selected from the group consisting of, parallel, square, rectangular, diamond, honeycomb, rhomboidal, trapezoidal, annular, ellipsoidal, oval, and circular.

7. The method according to claim 1, wherein said thin-film multi-axial magnetic anisotropy device comprises a stack of alternating layers of said piezoelectric material and said magnetic material.

8. The method according to claim 1, wherein said electrodes are disposed on a side, a top or a bottom of said thin-film multi-axial magnetic anisotropy device.

* * * * *